VARIABLE-FREQUENCY GENERATOR WITH THREE FEEDBACK CONTROLS

Filed Oct. 22, 1965 2 Sheets-Sheet 1

Inventor
Jean de Chaumont
By
Karl G. Ross
Attorney

Jan. 31, 1967 J. DE CHAUMONT 3,302,129

VARIABLE-FREQUENCY GENERATOR WITH THREE FEEDBACK CONTROLS

Filed Oct. 22, 1965 2 Sheets-Sheet 2

Inventor
Jean de Chaumont
By
Karl W. Flocks
Attorney 3,302,129
VARIABLE-FREQUENCY GENERATOR WITH THREE FEEDBACK CONTROLS
Jean de Chaumont, Pont-Sainte-Maxence, France, assignor to Charbonnages de France, Paris, Seine, France, a public institution of France
Filed Oct. 22, 1965, Ser. No. 500,856
Claims priority, application France, Nov. 12, 1964, 994,712
3 Claims. (Cl. 331—110)

Variable-frequency generators are known in which the frequency varies as a function of the variations of a resistance inserted in a measuring bridge.

A generator of this kind is constituted by an amplifier comprising a single reaction loop formed by the said measuring bridge and a 90° dephasing circuit. The unbalance voltage of the bridge, combined with the signal supplied by the dephasing circuit is applied to the input of the amplifier, through the intermediary of a selective circuit.

This selective circuit is an oscillating circuit.

Another generator of the same type has for its selective circuit another dephasing circuit and comprises in addition a device for correcting the influence of a reactive component.

In fact, these two generators are sensitive to any parasitic component in quadrature with the output signal of the bridge.

In these two generators, the oscillation is produced by a phase rotation of the combined signal (unbalanced voltage of the bridge-signal from the first dephasing circuit) by means of the selective circuit.

In addition, a frequency generator is known, in which the amplifier has a reaction loop constituted by a selective double-T bridge.

Finally, amplifiers are known in which the input attenuator is constituted by a transistor used without direct collector current.

The present invention has for its object a variable-frequency generator which is sensitive to any parasitic component in quadrature with the output signal of the bridge, and which comprises several reaction loops.

This generator permits the measurement or the distant measurement of the value or of the variation of a parameter such as for example, the methane content of the atmosphere in mine workings.

This improved generator only comprises passive circuits, the stability and the facility of adjustment of which are increased.

The variable-frequency generator according to the invention comprises an aperiodic high-gain amplifier with a low input resistance, and is characterized in that there is applied to its input, shunted by a variable resistance, a current resulting from the composition:

Of a reaction current in phase with the output voltage of the amplifier;

Of a current in quadrature with the said reaction current and injected by the measuring bridge, excited by a voltage having a frequency equal to the frequency delivered by the amplifier;

And of a current in phase opposition with the current injected by the measuring bridge, supplied by a selective circuit tuned to the frequency corresponding to the balance of the measuring bridge, this selective circuit being excited by a voltage of amplitude proportional to the signal exciting the measuring bridge and of such phase that, with reference to this signal, for an increase of the frequency delivered by the generator, the said selective circuit introduces a lagging dephasing of the resultant current applied to the input with respect to the output voltage of the amplifier.

According to a characteristic feature, the variable resistance which shunts the amplifier input has a resistance which decreases as the amplitude of the signal supplied by the oscillator increases.

In accordance with an alternative form, the measuring bridge is a bridge of complex impedances.

In accordance with a particular form of construction, the generator comprises, in combination:

An aperiodic amplifier provided with two output terminals supplying signals of proportional amplitudes and of opposite phases;

A first reaction loop constituted by a resistance coupling the first output terminal of the amplifier to its input;

A second reaction loop comprising a double-T bridge excited by the voltage appearing on the second output terminal of the amplifier and coupled to the input through a resistance;

A third reaction loop constituted by a measuring bridge excited by a fraction of the excitation voltage of the double-T bridge and in which the measurement diagonal is coupled to the input of the amplifier through a transformer having its secondary connected to the amplifier input through a condenser, the input of the amplifier being shunted by a variable resistance, the value of which is an inverse function of the amplitude of the voltage delivered by the generator.

According to an advantageous characteristic, the variable resistance is the resistance of the emitter-collector junction of a transistor in its saturation state, the base of which is controlled by the rectified and filtered output voltage, and of which one of the free electrodes is coupled to the input through a condenser of high value, while the other electrode is connected to earth.

The invention will be better understood by referring to the description which follows below and to the accompanying drawings which show, in a non-limitative manner, one form of construction of the variable-frequency generator according to the invention.

In these drawings:

FIG. 1 is a schematic diagram of the generator or oscillator of the invention;

FIGS. 2, 2*a*, 2*b* are vector diagrams of the voltages and currents present at certain particular points of the circuit according to the invention;

In the text which follows, there will be termed measuring bridge the Wheatstone bridge of which one of the arms is constituted by the variable impedance for setting the frequency.

Figure 1:
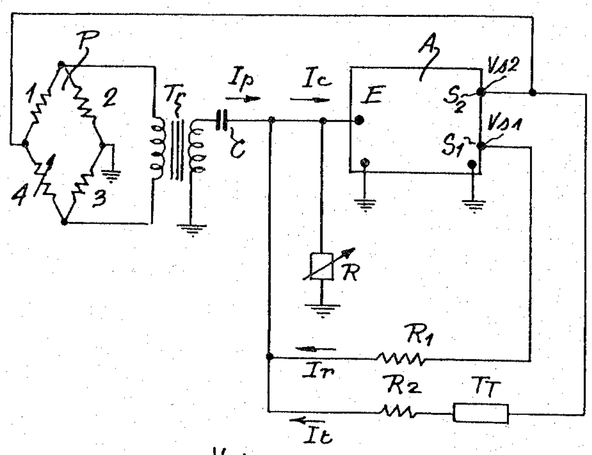
Figure 2:
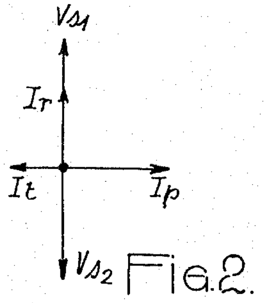
Figure 2A:
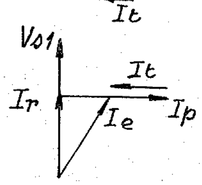
Figure 2B:
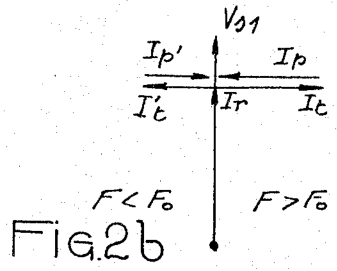

In FIG. 1, A represents a high-gain aperiodic amplifier which forms the heat of the oscillator. In addition to earth, it has an input terminal E and two output terminals $S_1$ and $S_2$ supplying two voltages $Vs_1$ and $Vs_2$ of proportional amplitudes and opposite phases, as shown in FIG. 2.

Between the input terminal E and earth, there is provided a variable resistance R, the use of which will be explained later. The output terminal $S_1$ is coupled to the input E through the resistance $R_1$ which introduces a reaction current $Ir$ in phase with the voltage $Vs_1$.

The measuring bridge P, composed of three fixed resistances 1, 2, 3 and a resistance 4, variable as a function of the parameter to be measured, is excited by the voltage $Vs_2$.

The unbalance voltage of the bridge P, appearing on the measuring diagonal opposite to the excitation diagonal, is applied to the input E through a transformer $Tr$, the primary winding of which is connected in the measuring diagonal of P, and the secondary winding is connected between E and earth through a condenser C.

For a given sense of unbalance of the bridge P, the latter introduces, through the intermediary of C, a current $Ip$ in quadrature with the excitation voltage $Vs_2$, for example in leading quadrature. This current $Ip$ will therefore be in quadrature of opposite sign with the voltage $Vs_1$, in the present case in lagging quadrature (FIG. 2).

The voltage $Vs_2$ or a fraction of this voltage, excites a double-T frequency bridge TT tuned to the frequency delivered by the generator when the bridge P is in equilibrium.

Through the intermediary of the resistance $R_2$, the bridge TT introduces a current $I_t$ in quadrature with its excitation voltage $Vs_2$ (FIG. 2).

Matters are arranged, for example by a correct connection of the transformer $Tr$, in order that the phases of the currents $Ip$ and $It$ are opposite for the same sense of unbalance of the bridge P.

The resultant input current $Ie$ is the vector sum of the three currents explained above (FIG. 2$a$).

As the amplifier A is linear and aperiodic, the only transformation which can be suffered in it by the input signal $Ie$ is an increase in amplitude.

This input signal not being deformed by A, should also not be deformed by the overall recircuit, which is selective: the signal supplied by the oscillator is therefore sinusoidal.

As the amplifier is aperiodic, it does not give any phase rotation to the input signal. In consequence, the overall reaction circuit must not in its turn dephase the input signal $Ie$ with respect to the collected signal $Vs_1$, which compels the quadrature components $It$ and $Ip$ to cancel each other.

If $Fo$ is the frequency delivered by the oscillator when the bridge P is in balance; $d$ is the ratio between the voltage appearing on the measuring diagonal of P and $Vs_2$:

(1) The current $It$ introduced by the bridge TT depends on the amplitude of $Vs_2$ and the oscillation frequency F. It is approximately proportional to the difference of frequency (F—$Fo$) over a fairly wide range, and to the amplitude of $Vs_2$, from which:

$$I_t=\alpha(Fo-F)Vs_2$$

(2) The current $Ip$ introduced by the condenser C is proportional to the unbalance $d$ of the bridge P, to the frequency F and to the amplitude of $Vs_2$.

$$I_p=KdFVs_2$$

Taking K as unity, there can therefore be written:

$$Ip=+It$$

or:

$$dF=\alpha(F_o-F)$$

$$F(d+\alpha)=\alpha F_o$$

$$F_o-F=\frac{\alpha F_o+dF_o-\alpha F_o}{d+\alpha}$$

$$F_o-F=\frac{d}{d+\alpha}F_o \qquad (1)$$

The term $\alpha$ can be considered as a constant over a fairly wide range of frequencies delivered by the oscillator, approximately for:

$$0.5F_o<F<1.5F_o$$

The relation (1) shows that the difference in frequency $Fo$—F and therefore the frequency F is coupled in a positive and unequivocal manner to the balance $d$.

Figure 3:
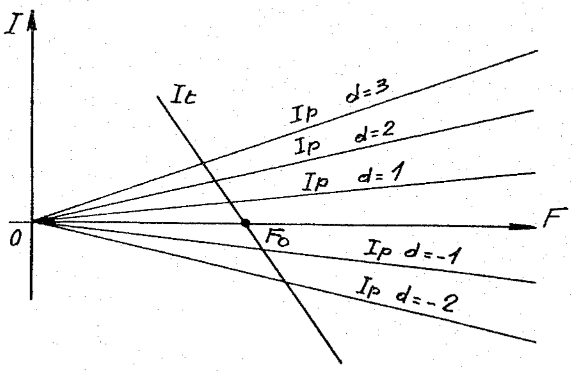
FIGS. 3 and 4 are diagrams of the characteristics of the oscillator according to the invention.

The relation (1) can be shown by FIG. 3, which is the superimposition of the systems of characteristics $I=f(F)$ of the bridge P on the one hand and of the bridge TT on the other.

Figure 4:
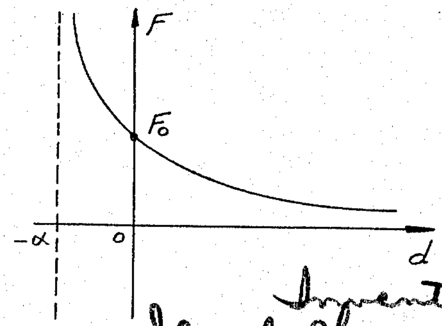

FIG. 4 is a more suignificant form of representation of the relation (1). It gives the curve $F=f(d)$, which may be considered as the calibration curve of the oscillator.

Mention has been made above the presence of the variable resistance R in shunt with the input E. This is in fact essential in order to ensure for the amplifier A its qualities of linearity and aperiodicity.

This element, which fulfills the functions of a variable attenuator, is advantageously controlled by the amplitude of the output signal $Vs_2$, for example.

It comes into operation above a certain amplitude of $Vs_2$ by forming a variable shunt through which the current increases as the amplitude of the output signal $Vs_2$ increases. This is equivalent to reducing the gain of the whole unit (amplifier+attenuator) to a value very close to 1.

In this way, the saturation of one or more stages of the amplifier is avoided; there is eliminated a source of distortion and the signal supplied is purely sinusoidal. However, the amplifier still has slight distortion, but the harmonics thus introduced are transmitted without phase-shift by the bridge TT and are thus applied in negative feed-back to the input of the amplifier, which assists in reducing their resultant amplitude. The bridge TT thus acts as a shaping device for the output signal.

There have been shown in FIG. 2$b$ the vector diagrams $$\vec{Ie}=\vec{Ir}+\vec{It}+\vec{Ip}$$

for the two directions of unbalance of the bridge P.

Figure 5:
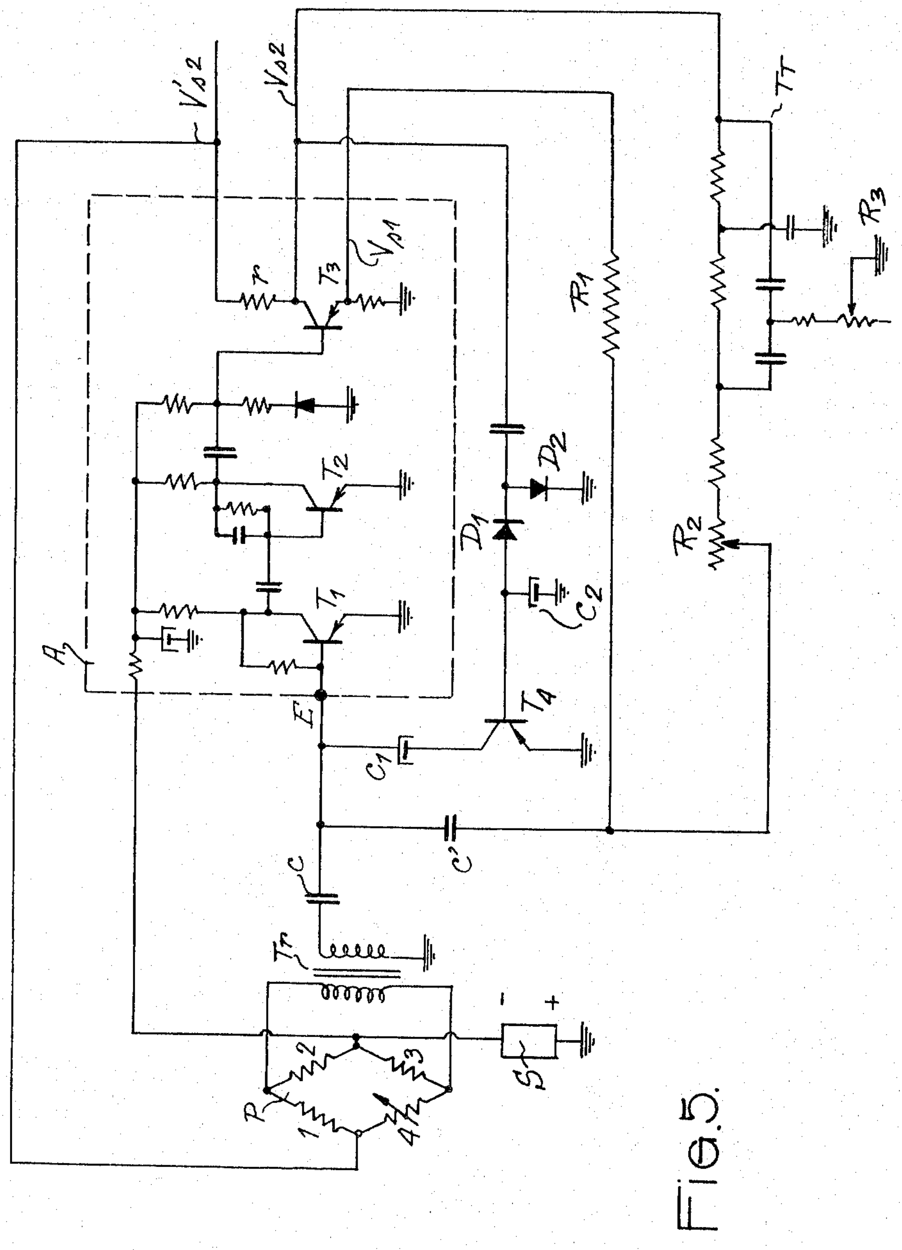
FIG. 5 is a complete diagram of one form of construction of an oscillator according to the invention, permitting measurement of the methane content of the atmosphere of mine workings.

In the form of embodiment of an oscillator according to the invention, permitting the measurement of the methane content of the atmosphere in mine workings, shown in FIG. 5, the measuring bridge P is a catalytic bridge in which 4 is the resistance of a hot platinum filament immersed in a sample of the atmosphere to be tested. It is known that with a bridge of this kind, the out-of-balance voltage is proportional to the methane content of the atmosphere under test.

The heating current of the catalytic filament 4 is supplied by a source S of direct current, which also serves to supply the remainder of the circuit according to the invention.

The amplifier A comprises three stages of amplification built round the transistors $T_1$, $T_2$ and $T_3$, the base of $T_1$ serving as the input terminal E, the emitter of $T_3$ being the terminal $S_1$ and the collector of $T_3$ being the terminal $S_2$.

The voltage $Vs_1$ appearing on the emitter of $T_3$ is applied to E through the fixed resistance $R_1$ in series with the condenser C′ of high value (and therefore of low impedance for the range of frequencies to be covered) which does not dephase the current $Ir$ with respect to $Vs_1$.

The voltage $Vs_2$ appearing on the collector of $T_3$, of opposite phase to $Vs_1$, excites the bridge TT tuned by means of the potentiometer $R_3$ to the frequency corresponding to the equilibrium of the measuring bridge P. The bridge TT introduces, through the potentiometer $R_2$ and the condenser C′, the current $It$ in quadrature with $Ir$.

By means of the resistance $r$ connected in the collector circuit of $T_3$ there is collected a signal $V's_2$, the amplitude of which is proportional to $Vs_2$.

The voltage $V's_2$ excites the measuring bridge P, the out-of-balance voltage of which is a pulsating direct-current voltage. Only the alternating component is transmitted through the intermediary of the transformer $Tr$ to the condenser C, which introduces the current $Ip$ in phase opposition with $It$.

According to a characteristic feature of the invention, the variable attenuator resistance is constituted by the saturation resistance of a transistor $T_4$, the emitter-collector junction of which is connected between E and earth, and the collector of which, in the present case, is connected to E through a condenser $C_1$ of high value (and therefore of low impedance for the alternating signal I$e$).

The base of $T_4$ is controlled by the signal $Vs_2$, rectified by means of the diodes $D_1$ and $D_2$ and filtered by means of the condenser $C_2$.

The transistor $T_4$ is thus utilized without current collector, which does not affect in any way its saturation resistance, but prevents this resistance from being traversed by a variable direct current. There is thus avoided the appearance of a direct current collector-emitter voltage which is variable in dependence on the saturation resistance. This direct-current voltage, which may be of high value, would produce a signal super-imposed on the input signal I$e$, and could cause the saturation of the amplifier A, thereby compromising the desired linearity and aperiodicity of the amplifier.

It should be noted that the transistor $T_4$ only comes into action above a certain amplitude of $Vs_2$, depending on the thresholds of $D_1$, $D_2$ and $T_4$.

The amplifier A has a low input resistance; for this reason, the input voltage is very small and the coupling between the different reaction paths is negligible.

To sum-up, it can be said that by virtue of $T_4$ working without variation of the polarization of its collector, the gain of the amplifier is varied without having to vary the polarization of its first stage, which ensures the linearity of the said amplifier.

The circuit is characterized by the ease of its adjustments, which are independent and particularly simple.

The technology of construction is considerably simplified, since the generator according to the invention only comprises passive and linear elements.

The fidelity of its response is increased, since it does not comprise any element capable of introducing stray phase-shifts (such as for example of the leakage inductance of a tuned oscillatory circuit).

All its components operate in an optimum manner, in particular the selective circuit, which has only to deal with a pure frequency, free from all harmonics.

It is obvious that the selective circuit may be other than a double-T frequency bridge provided that, over the range of frequencies to be covered, it can supply a current in quadrature with the current introduced by the first reaction loop.

Its excitation should however be such that for any increase in frequency supplied by the generator, it introduces a lagging phase-shift on the resultant current applied to the input of the amplifier, so as to bring this resultant current into phase with the current supplied by the first reaction loop.

On the other hand, the measuring bridge may be constituted by impedances other than resistances, provided that the bridge can introduce, through the intermediary of a correctly-designed coupling circuit, a current in phase opposition with the current supplied by the selective circuit.

I claim:

1. A high-gain aperiodic variable-frequency generator having a low input resistance, said generator comprising a measuring bridge, an amplifier of which one frequency corresponds to the balance of said bridge, an input attenuator for said amplifier, and a selective circuit, in which there is applied to the input of said amplifier, a current resulting from the following composition:
   - a reaction current in phase with the output voltage of the amplifier;
   - a current in quadrature with said reaction current and injected by the measuring bridge, said bridge being excited by a voltage of frequency equal to the frequency delivered by said amplifier;
   - and a current in phase opposition with the current injected by the measuring bridge, said opposition current being supplied by the selective circuit tuned to the frequency corresponding to the equilibrium of the bridge, said selective circuit being excited by a voltage of amplitude proportional to the signal exciting the bridge of phase such, with respect to said signal, that for a variation of the frequency delivered by the generator, said selective circuit introduces a lagging phase-shift of the resultant current applied to the input of the amplifier, with respect to the output voltage of said amplifier.

2. A variable-frequency generator as claimed in claim 1, comprising, in combination:
   - the aperiodic amplifier provided with two output terminals supplying signals of proportional amplitudes and of opposite phase;
   - a resistance coupling one output terminal of the amplifier to its input and constituting a first reaction loop;
   - a double-T frequency bridge and a resistance, constituting at the same time the selective circuit and a second reaction loop coupling the other output terminal of the amplifier to its input;
   - a transformer and a condenser arranged between the secondary of this transformer and the input of the amplifier;
   - the measuring bridge constituting a third reaction loop and excited by a fraction of the excitation voltage of said selective circuit, the measuring diagonal of which is connected to the input of the amplifier by means of the said transformer and said condenser;
   - a variable resistance constituting the variable attenuator shunting the input of the amplifier, and the value of which is an inverse function of the amplitude of the voltage delivered by the generator.

3. A variable-frequency generator as claimed in claim 2, comprising a transistor and a condenser of high value, and in which the variable resistance is the resistance of the emitter-collector junction of said transistor in its saturation state, the base of which is controlled by the rectified and filtered output voltage of the amplifier, and of which one of the free electrodes is coupled to the input of said amplifier through said condenser, while the other electrode is connected to earth.

No references cited.

ROY LAKE, *Primary Examiner.*

J. KOMINSKI, *Assistant Examiner.*